United States Patent
Lee et al.

(10) Patent No.: US 8,241,933 B2
(45) Date of Patent: Aug. 14, 2012

(54) ORGANIC LIGHT EMITTING DIODE DISPLAY AND METHOD OF MANUFACTURING THE SAME

(75) Inventors: Sun-Youl Lee, Yongin (KR); Koji Suzuki, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/647,126

(22) Filed: Dec. 24, 2009

(65) Prior Publication Data

US 2010/0200861 A1   Aug. 12, 2010

(30) Foreign Application Priority Data

Feb. 9, 2009   (KR) .................. 10-2009-0010262

(51) Int. Cl.
*H01L 33/00*   (2010.01)
(52) U.S. Cl. .............. 438/29; 438/22; 438/155; 257/40; 257/59; 257/72; 257/E33.053
(58) Field of Classification Search .................. 438/29, 438/158; 257/72, 40, E33.053, E21.414
See application file for complete search history.

(56) References Cited

U.S. PATENT DOCUMENTS

| | | |
|---|---|---|
| 2005/0062057 A1 | 3/2005 | Yamazaki et al. |
| 2007/0139571 A1* | 6/2007 | Kimura ........................ 349/43 |
| 2008/0111484 A1* | 5/2008 | Kwon et al. ................. 313/506 |
| 2009/0261369 A1* | 10/2009 | Komori et al. ................ 257/98 |

FOREIGN PATENT DOCUMENTS

| | | |
|---|---|---|
| CN | 1457220 | 11/2003 |
| CN | 1599056 | 3/2005 |
| CN | 1949511 | 4/2007 |
| JP | 2004-046154 | 2/2004 |
| JP | 2005-093396 | 4/2005 |
| JP | 2007-133371 | 5/2007 |
| KR | 1020030058911 | 7/2003 |
| KR | 10-2005-0105852 | 11/2005 |
| KR | 10-0787461 | 12/2007 |
| KR | 1020080090924 | 10/2008 |

OTHER PUBLICATIONS

Translation of Korean patent publication 1020030058911 of record.*

* cited by examiner

*Primary Examiner* — Mamadou Diallo
(74) *Attorney, Agent, or Firm* — H.C. Park & Associates, PLC (57) ABSTRACT

An organic light emitting diode display and a method of manufacturing the display, the organic light emitting diode display including: a substrate; a semiconductor layer formed on the substrate, having a channel region, a source region, and a drain region; a gate insulating layer covering the semiconductor layer; a gate electrode formed on the channel region; and an interlayer insulating layer covering the gate electrode. Source and drain electrodes are formed on the interlayer insulating layer, and are connected to the source and drain regions, respectively. A pixel electrode extends from the drain electrode, in the same plane as the source and drain electrodes. The source and drain electrodes each have a first conductive layer formed of a transparent conductive material, and a metallic second conductive layer formed on the first conductive layer. The pixel electrode is formed from the first conductive layer.

11 Claims, 8 Drawing Sheets

ORGANIC LIGHT EMITTING DIODE DISPLAY AND METHOD OF MANUFACTURING THE SAME

CROSS-REFERENCE TO RELATED APPLICATION

This application claims the benefit of Korean Patent Application No. 10-2009-0010262 filed on Feb. 9, 2009, in the Korean Intellectual Property Office, the disclosure of which is incorporated herein, by reference.

BACKGROUND OF THE INVENTION

1. Field of the Invention

Aspects of the present invention relate to an organic light emitting diode display and a method of manufacturing the same.

2. Description of the Related Art

An organic light emitting diode (OLED) display has self-emissive characteristics, and differs from a liquid crystal display (LCD), in that it does not require a separate light source and has a reduced thickness and weight. Furthermore, an organic light emitting diode display consumes less power, has a higher luminance, and a shorter response time than a LCD, so it has been highlighted as a next generation display device for portable electronic appliances.

An organic light emitting diode display includes organic light emitting diodes, and thin film transistors for driving the organic light emitting diodes. The organic light emitting diode includes a hole injection electrode, an organic emissive layer, and an electron injection electrode, and the thin film transistor includes a semiconductor layer, a gate electrode, a source electrode, and a drain electrode.

During fabrication of such an organic light emitting diode display, several thin film processes (using masks) are conducted to form the respective electrodes, wires, and other layers. Accordingly, as organic light emitting diode displays become more complicated in structure, the number of thin film processes is increased, resulting in increased processing failures, reduced productivity, and increased production costs.

The above information disclosed in this Background section is only for enhancement of understanding of the background of the invention, and therefore, may contain information that does not constitute prior art.

SUMMARY OF THE INVENTION

Aspects of the present invention provide an organic light emitting diode display having a simplified structure, which can be produced by a simplified manufacturing method.

An exemplary embodiment of the present invention provides an organic light emitting diode display including: a substrate; a semiconductor layer formed on the substrate, having a channel region, a source region, and a drain region; a gate insulating layer covering the semiconductor layer; and a gate electrode formed on the channel region. An interlayer insulating layer covers the gate electrode. Source and drain electrodes are formed on the interlayer insulating layer, and are connected to the source and drain regions, respectively. A pixel electrode extends from the drain electrode and is disposed in the same plane as the source and drain electrodes. The source and drain electrodes each have a first conductive layer, comprising a transparent conductive material, and a second conductive layer formed on the first conductive layer, comprising a metallic material. The pixel electrode is formed from a portion of the first conductive layer.

According to aspects of the present invention, the first conductive layer may contain at least one material selected from indium tin oxide (ITO), indium zinc oxide (IZO), zinc oxide (ZnO), and indium oxide ($In_2O_3$).

According to aspects of the present invention, the first conductive layer may be crystallized.

According to aspects of the present invention, the gate insulating layer and the interlayer insulating layer may each have contact holes exposing the source and drain regions of the semiconductor layer, and the source and drain electrodes may be connected to the source and drain regions of the semiconductor layer, through the contact holes.

According to aspects of the present invention, a pixel definition layer may cover the source and drain electrodes. The pixel definition layer may have an opening exposing the pixel electrode.

According to aspects of the present invention, an organic emissive layer may be formed on the pixel electrode, within the opening of the pixel definition layer, and a common electrode may be formed on the organic emissive layer and the pixel definition layer.

According to aspects of the present invention, the organic emissive layer may emit light in the direction of the pixel electrode.

According to aspects of the present invention, the common electrode may include a reflective layer formed of at least one material selected from lithium (Li), calcium (Ca), lithium fluoride/calcium (LiF/Ca), lithium fluoride/aluminum (LiF/Al), aluminum (Al), silver (Ag), magnesium (Mg), and gold (Au).

Another exemplary embodiment of the present invention provides a method of manufacturing an organic light emitting diode display, which includes: forming an amorphous silicon layer on a substrate; forming a gate insulating layer that covers the amorphous silicon layer; forming a gate electrode on the gate insulating layer; and crystallizing and selectively doping the amorphous silicon layer, to thereby form a semiconductor layer having a channel region, a source region, and a drain region. The method further includes: forming an interlayer insulating layer that covers the gate electrode; forming contact holes in the interlayer insulating layer and the gate insulating layer, which expose the source and drain regions of the semiconductor layer; forming a first conductive layer on the interlayer insulating layer, such that it contacts the source and drain regions of the semiconductor layer, through the contact holes; forming a second conductive layer on the first conductive layer; patterning the first and second conductive layers through photolithography, to thereby form source and drain electrodes, each having a double-layered structure; and patterning the first conductive layer to form a pixel electrode having a single-layered structure.

According to aspects of the present invention, the photolithography process may be conducted using a photoresist pattern formed through half-tone exposure process.

According to aspects of the present invention, the photoresist pattern may have: a first portion placed on a formation region of the source and drain electrodes; a thinner second portion placed on a formation region of the pixel electrode; and a third portion exposing the second conductive layer.

According to aspects of the present invention, the photolithography process may include: forming the photoresist pattern on the second conductive layer; sequentially etching and removing portions of the second and first conductive layers corresponding to the third portion of the photoresist pattern, using the photoresist pattern; removing the second portion of the photoresist pattern; and etching and removing only a portion of the second conductive layer corresponding to the second portion of the photoresist pattern, using the photoresist pattern, after the second portion thereof is removed.

According to aspects of the present invention, the first conductive layer may include at least one material selected from indium tin oxide (ITO), indium zinc oxide (IZO), zinc oxide (ZnO), and indium oxide ($In_2O_3$).

According to aspects of the present invention, the method may further include crystallizing the first conductive layer.

According to aspects of the present invention, the method may further include forming a pixel definition layer that covers the source and drain electrodes, which has an opening exposing the pixel electrode.

According to aspects of the present invention, the method may further include forming an organic emissive layer on the pixel electrode, within the opening of the pixel definition layer, and forming a common electrode on the organic emissive layer and the pixel definition layer.

According to aspects of the present invention, the organic emissive layer may emit light in the direction of the pixel electrode.

According to aspects of the present invention, the common electrode may include a reflective layer formed of at least one material selected from lithium (Li), calcium (Ca), lithium fluoride/calcium (LiF/Ca), lithium fluoride/aluminum (LiF/Al), aluminum (Al), silver (Ag), magnesium (Mg), and gold (Au).

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EXEMPLARY EMBODIMENTS

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Parts that are irrelevant to the description are omitted, in order to clearly describe the aspects of the present invention. Furthermore, the size and thickness of the respective structural components shown in the drawings are arbitrarily illustrated for explanatory convenience, and the present invention is not necessarily limited thereto.

It will be understood that when an element such as a layer, film, region, or substrate is referred to as being formed or disposed "on" another element, it can be disposed directly on the other element, or intervening elements may also be present. In contrast, when an element is referred to as being formed or disposed "directly on" another element, there are no intervening elements present.

Furthermore, even though an active matrix (AM) organic light emitting diode (OLED) display having a 2Tr-1 Cap structure, including two thin film transistors (TFT) and one capacitor at each pixel, is illustrated in the appended drawings, the present invention is not limited thereto. The organic light emitting diode display may have three or more thin film transistors, two or more capacitors at each pixel, and various structures with separate wires. A pixel is a minimum image display unit, and an image is formed using a plurality of pixels.

Figure 1:
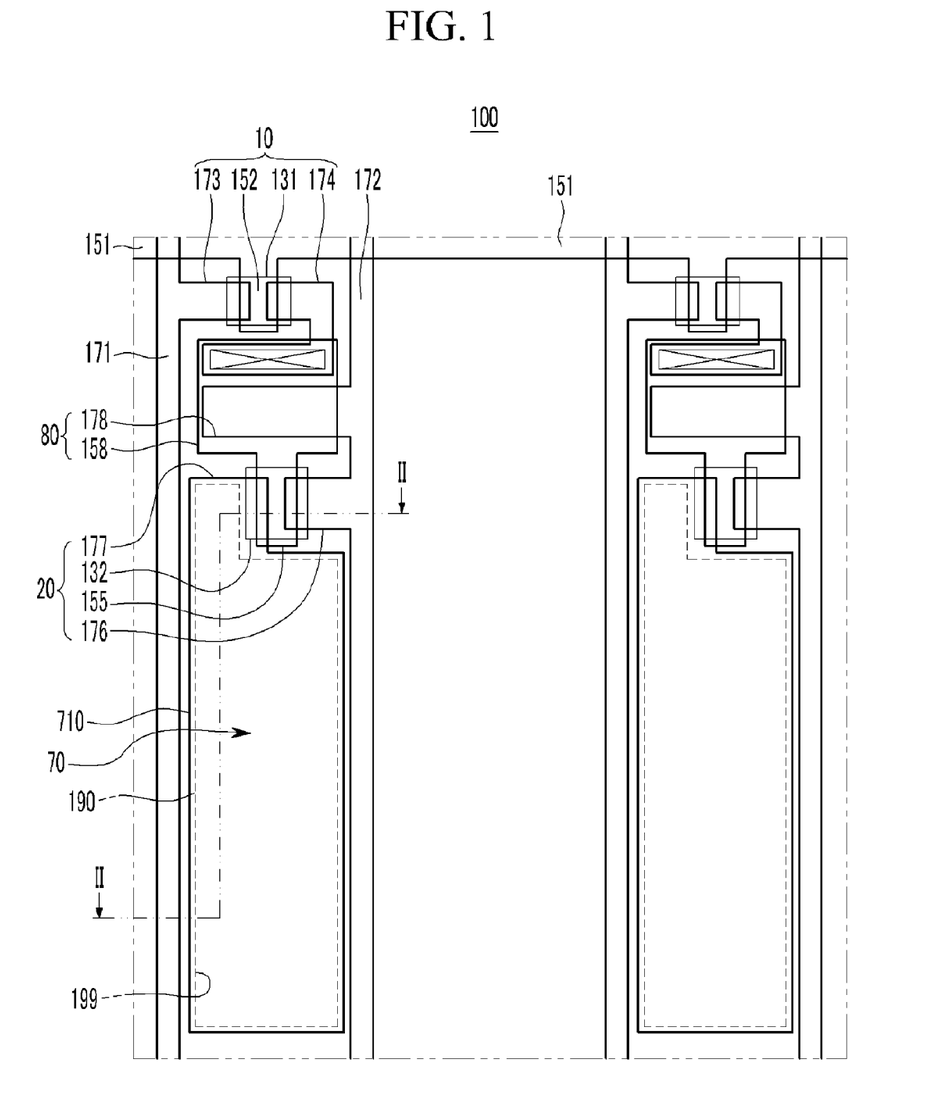
FIG. 1 is a layout view of an organic light emitting diode (OLED) display, according to an exemplary embodiment of the present invention.
Figure 2:
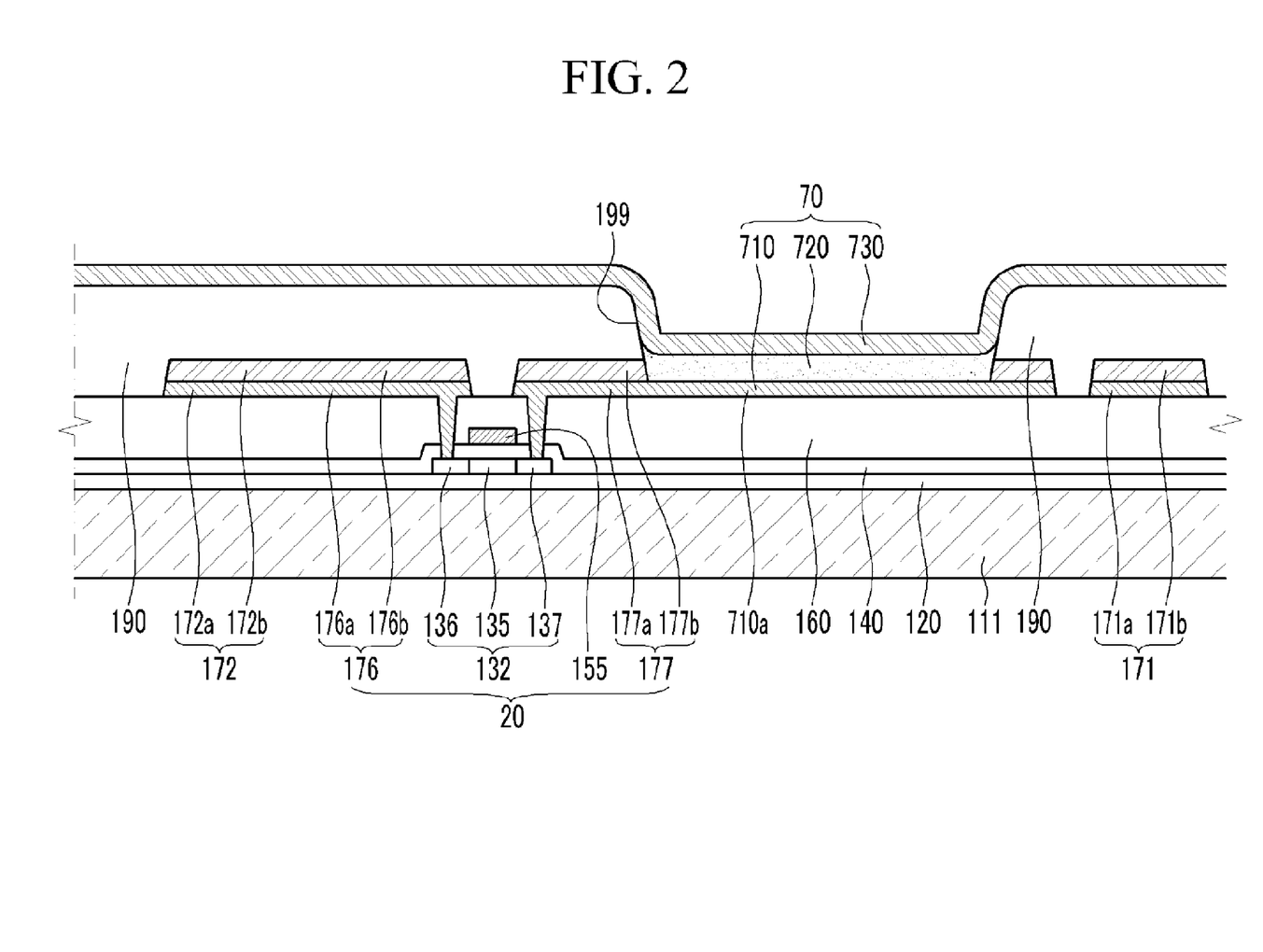
FIG. 2 is a cross-sectional view of the organic light emitting diode display taken along the II-II line of FIG. 1.

An organic light emitting diode display 100, according to an exemplary embodiment of the present invention, will be now described with reference to FIG. 1 and FIG. 2. As shown in FIG. 1 and FIG. 2, the organic light emitting diode display 100 includes a switching thin film transistor 10, a driving thin film transistor 20, a capacitor 80, and an organic light emitting diode (OLED) 70, which are formed at each pixel. The organic light emitting diode display 100 further includes gate lines 151, and data lines 171 and common power lines 172 which cross and are insulated from the gate lines 151. Here, each pixel is defined by taking a gate line 151, a data line 171, and a first common power line 172 as a boundary, but is not limited thereto.

The organic light emitting diode 70 includes a pixel electrode 710, an organic emissive layer 720 formed on the pixel electrode 710, and a common electrode 730 formed on the organic emissive layer 720. The pixel electrode 710 operates as a positive (+) electrode, or anode, and can be referred to as a hole injection electrode. The common electrode 730 operates as a negative (−) electrode, or cathode, and can be referred to as an electron injection electrode. However, the present invention is not limited thereto, and depending upon the way the organic light emitting diode display 100 is driven, it is possible that the pixel electrode 710 operates as the cathode, and the common electrode 730 operates as the anode. Holes and electrons from the pixel electrode 710 and the common electrode 730 are injected into the organic emissive layer 720. Excitons are formed by the combination of electrons and holes. When the excitons shift from an excited state to a ground state, light is emitted. One or more pixel electrodes 710 are formed in each pixel, and the organic light emitting diode display 100 has a plurality of pixel electrodes 710 that are spaced apart from each other.

The capacitor 80 has first and second capacitor electrode plates 158 and 178, and a gate insulating layer 140 interposed between the two capacitor electrode plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is a switch for selecting pixels to emit light. The switching gate electrode 152 is connected to the gate line 151. The switching source electrode 173 is connected to the data line 171. The switching drain electrode 174 is spaced apart from the switching source electrode 173 and is connected to the first capacitor electrode plate 158.

The driving thin film transistor 20 applies a driving voltage to the pixel electrode 710, to excite the organic emissive layer 720 of the organic light emitting diode 70, in a selected pixel.

The driving gate electrode 155 is connected to the first capacitor electrode plate 158. The driving source electrode 176 and the second capacitor electrode plate 178 each are connected to the common power line 172. The driving drain electrode 177 is connected to the pixel electrode 710. The pixel electrode 710 extends from the driving drain electrode 177, in the same plane as the driving source electrode 176 and the driving drain electrode 177.

The switching thin film transistor 10 is operated by a gate voltage applied to the gate line 151, and transmits a data voltage applied to the data line 171, to the driving thin film transistor 20. A voltage, corresponding to a difference between the common voltage applied to the driving thin film transistor 20 from the common power line 172 and the data voltage transmitted from the switching thin film transistor 10, is stored at the capacitor 80. A current corresponding to the voltage stored in the capacitor 80 flows to the organic light emitting diode 70, through the driving thin film transistor 20, to thereby excite the organic light emitting diode 70.

Figure 3:
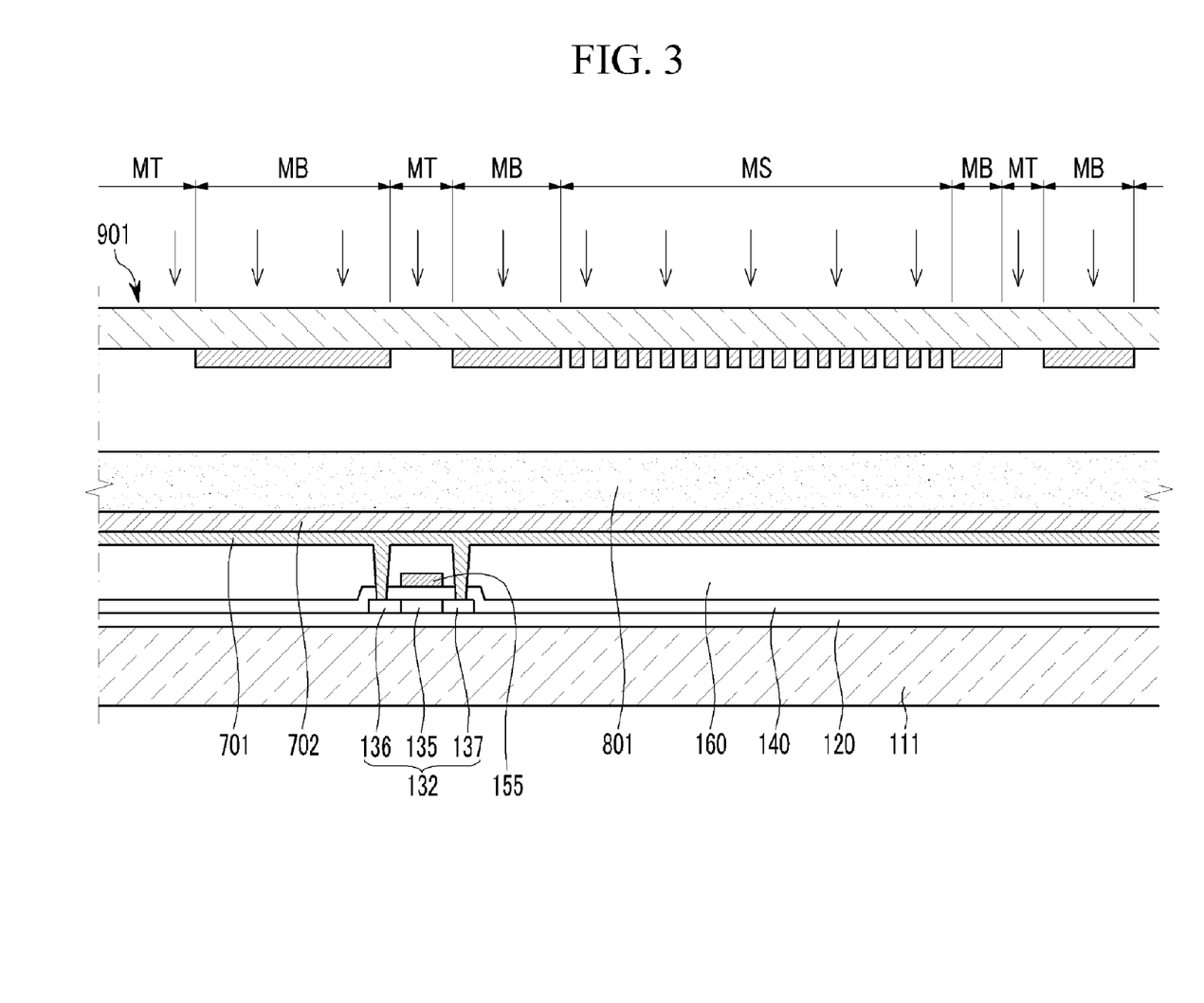
FIGS. 3-8 are cross-sectional views sequentially illustrating a process of manufacturing the organic light emitting diode display shown in FIG. 2.

The driving source electrode 176, the driving drain electrode 177, and the pixel electrode 710 are formed in the same plane, through a single thin film process, using a mask 901 shown in FIG. 3. The driving source electrode 176 and the driving drain electrode 177 each include first conductive layers 176a and 177a and second conductive layers 176b and 177b, respectively. In other words, the driving source electrode 176 and the driving drain electrode 177 have a dual layered structure. The pixel electrode 710 has a single-layered structure, and includes only a first conductive layer 710a. The thin film process includes conducting photolithography. The first conductive layers 176a, 177a, and 710a are formed of a transparent conductive material. The second conductive layers 176b and 177b are formed with a metallic material having a high electric conductivity. Accordingly, the organic light emitting diode display 100 has a simplified structure and may be fabricated through a reduced number of processing operations.

The structure of the organic light emitting diode display 100 will now be described specifically with reference to FIG. 2. FIG. 2 illustrates the organic light emitting diode display 100, while centering on the driving thin film transistor 20 and the organic light emitting diode 70.

The structure of a thin film transistor that can be included in the organic light emitting diode display 100 will be described hereinafter, based on the driving thin film transistor 20. The switching thin film transistor 10 shown in FIG. 1 will be described with respect to differences thereof from the driving thin film transistor 20. The substrate 111 is formed of an insulating material, such as glass, quartz, ceramic, or plastic. However, the present invention is not limited thereto. The substrate 111 may be formed of a metallic material, such as stainless steel.

A buffer layer 120 is formed on the substrate 111. The buffer layer 120 prevents the diffusion of impurities and serves as a planarization layer. The buffer layer 120 may be formed of various materials, for example, the buffer layer 120 may be formed with at least one material selected from silicon nitride (SiNx), silicon oxide ($SiO_2$), and silicon oxynitride (SiOxNy). However, the buffer layer 120 is not necessarily required, and hence may be omitted depending upon the material of the substrate 111 and processing conditions.

A driving semiconductor layer 132 is formed on the buffer layer 120. The driving semiconductor layer 132 is formed of polycrystalline silicon. The driving semiconductor layer 132 has a channel region 135 that is not doped with impurities, and p+ doped source and drain regions 136 and 137 formed on both sides of the channel region 135. The dopant ion material is a P-type impurity, such as boron (B), and may be formed primarily of $B_2H_6$. Other impurities may be used, according to the type of the thin film transistor.

While a p-type metal-oxide semiconductor (PMOS) is used as the driving thin film transistor 20, the driving thin film transistor 20 is not limited thereto. For example, an n-type metal-oxide semiconductor (NMOS), or a complementary metal-oxide semiconductor (CMOS), may also be used as the driving thin film transistor 20. Furthermore, although the driving thin film transistor 20 shown in FIG. 2 is a polycrystalline thin film transistor, the switching thin film transistor 10 may be an amorphous silicon thin film transistor.

A gate insulating layer 140 is formed on the driving semiconductor layer 132. The gate insulating layer 140 can be formed of silicon nitride (SiNx) or silicon oxide ($SiO_2$). Gate wiring, including gate electrodes 155, is formed on the gate insulating layer 140. The gate wiring further includes the gate lines 151 shown in FIG. 1, the first capacitor electrode plates 158 shown in FIG. 1, and/or other wiring lines. The driving gate electrode 155 is overlaps at least a part of the driving semiconductor layer 132. In particular, the driving gate electrode 155 overlaps the channel region 135.

An interlayer insulating layer 160 is formed on the gate insulating layer 140, such that it covers the driving gate electrodes 155. The gate insulating layer 140 and the interlayer insulating layer 160 have corresponding contact holes exposing the source and drain regions 136 and 137 of the driving semiconductor layer 132. The interlayer insulating layer 160 and the gate insulating layer 140 can be formed of silicon nitride (SiNx) or silicon oxide ($SiO_2$).

Data wiring, including driving source and drain electrodes 176 and 177, is formed on the interlayer insulating layer 160. The data wiring further includes data lines 171, common power lines 172, second capacitor electrode plates 178 (FIG. 1), and/or other wiring lines.

The driving source and drain electrodes 176 and 177 are connected to the source and drain regions 136 and 137 of the driving semiconductor layer 132, respectively, via the through-holes. In this way, the driving thin film transistor 20 is formed along with the driving semiconductor layer 132, the driving gate electrode 155, and the driving source and drain electrodes 176 and 177. The structure of the driving thin film transistor 20 is not limited to the above and may be altered in various ways.

The driving source electrode 176, the driving drain electrode 177, the data line 171, and the common power line 172 all have a double-layered structure and each include first conductive layers 176a, 177a, 171a, and 172a, which are formed of a transparent conductive material, and second conductive layers 176b, 177b, 171b, and 172b formed on the first conductive layers 176a, 177a, 171a, and 172a, respectively. The second conductive layers 176b, 177b, 171b, and 172b are formed of a metallic material.

The organic light emitting diode display 100, the data wiring further includes pixel electrodes 710. Each pixel electrode 710 extends from one of the driving drain electrodes 177, in the same plane as the driving source and drain electrodes 176 and 177. However, as differentiated from the driving source and drain electrodes 176 and 177, the pixel electrode 710 has a single-layered structure, formed of only a first conductive layer 710a.

The data wiring includes the second capacitor electrode plates 178 shown in FIG. 1, but the present invention is not limited thereto. The second capacitor electrode plates 178 may be formed in a different plane than the data wiring. For example, the second capacitor electrode plate 178 may be formed of a polycrystalline silicon layer, in the same plane as the driving semiconductor layer 132. That is, the capacitor 80 may be formed along with the first capacitor electrode plate 158, in the same plane as the driving gate electrode 155 and the second capacitor electrode plate 178, which are formed in the same plane as the driving semiconductor layer 132.

The pixel definition layer 190 is formed on the interlayer insulating layer 160, such that it covers the data wiring 171, 172, 176, and 177, but does not cover the pixel electrode 710. That is, the pixel definition layer 190 covers the data wires 171, 172, 176, and 177, and has openings 199 exposing the pixel electrodes 710. The pixel definition layer 190 may be formed of a resin, such as polyacrylate resin or a polyimide resin.

An organic emissive layer 720 is formed on the pixel electrode 710, within one of the openings 199 of the pixel definition layer 190. A common electrode 730 is formed on the pixel definition layer 190 and the organic emissive layer 720. In this way, each organic light emitting diode 70 includes the pixel electrode 710, the organic emissive layer 720, and the common electrode 730.

The organic emissive layer 720 can be formed of a low molecular-weight organic material, or a high molecular-weight organic material. The organic emissive layer 720 may have a multi-layered structure, including some or all of an emission layer, a hole injection layer (HIL), a hole transport layer (HTL), an electron transport layer (ETL), and an electron injection layer (EIL). If the organic emissive layer 720 is formed with all of the layers, the hole injection layer (HIL) is disposed on the pixel electrode 710 (anode), and is sequentially overlaid with the hole transport layer (HTL), the emission layer, the electron transport layer (ETL), and the electron injection layer (EIL).

As shown in FIG. 2, the organic emissive layer 720 is disposed only in the opening 199 of the pixel definition layer 190, but the present invention is not limited thereto. For example, the organic emissive layer 720 may be formed on the pixel electrode 710, within the opening 199 of the pixel definition layer 190, or disposed between the pixel definition layer 190 and the common electrode 730. Specifically, the hole injection layer (HIL), the hole transport layer (HTL), the electron transport layer (ETL), and the electron injection layer (EIL), which are included in the organic emissive layer 720, may be formed on the pixel definition layer 190, as well as on the pixel electrode 710, using an open mask. By contrast, if the emissive layer 720 is formed in the respective openings 199, it is formed using a fine metal mask (FMM) process. That is, one or more layers of the organic emissive layer 720 may be interposed between the pixel definition layer 190 and the common electrode 730.

The first conductive layers 710a, 176a, 177a, 171a, and 172a of the pixel electrode 710, the source electrode 176, the drain electrode 177, the data line 171, and the common power line 172 are formed of a transparent conductive material including at least one material selected from indium tin oxide (ITO), indium zinc oxide (IZO), zinc oxide (ZnO), and indium oxide ($In_2O_3$). The first conductive layers 710a, 176a, 177a, 171a, and 172a are crystallized, in order to heighten the electrical conductivity thereof.

The common electrode 730 includes a metallic reflective layer formed of at least one material selected from lithium (Li), calcium (Ca), lithium fluoride/calcium (LiF/Ca), lithium fluoride/aluminum (LiF/Al), aluminum (Al), silver (Ag), magnesium (Mg), and gold (Au). Accordingly, the organic emissive layer 720 emits light in the direction of the pixel electrode 710, so as to display an image. That is, the organic light emitting diode display 100 is made as a rear-emission type.

With the above-described structural features, the organic light emitting diode display 100 may have a simplified structure. Particularly, with the rear side emission organic light emitting diode display 100, it becomes possible to form the pixel electrode 710 and the driving drain electrode 177 simultaneously.

A method of manufacturing an organic light emitting diode display 100, according to an exemplary embodiment of the present invention, will now be described with reference to FIGS. 3-8. As shown in FIG. 3, after the buffer layer 120 is formed on the substrate 111, an amorphous silicon layer (not shown) is deposited onto the buffer layer 120 and patterned. A gate insulating layer 140 is formed on the amorphous silicon layer (not shown), such that it covers the amorphous silicon layer, and a gate electrode 155 is formed on the amorphous silicon layer, with the gate insulating layer 140 therebetween.

Thereafter, the amorphous silicon layer (not shown) is crystallized and selectively doped, so as to form the semiconductor layer 132. The semiconductor layer 132 includes a channel region 135 disposed under the gate electrode 155, and source and drain regions 136 and 137 formed on respective sides of the channel region 135.

The interlayer insulating layer 160 is then formed, such that it covers the gate electrode 155. Contact holes are formed in the interlayer insulating layer 160 and the gate insulating layer 140, such that they expose the source and drain regions 136 and 137 of the semiconductor layer 132. The first conductive layer 701 is formed on the interlayer insulating layer 160, such that it contacts the source and drain regions 136 and 137 through the contact holes. A second conductive layer 702 is formed on the first conductive layer 701.

A photosensitive material layer 801 is formed on the second conductive layer 702, and is half-tone exposed using the mask 901. The mask 901 has a light blocking section MB, a transparent section MT, and a semi-transparent section MS. In FIG. 3 the semi-transparent mask section MS is shown to form a slit-pattern, but the present invention is not limited thereto.

Figure 4:
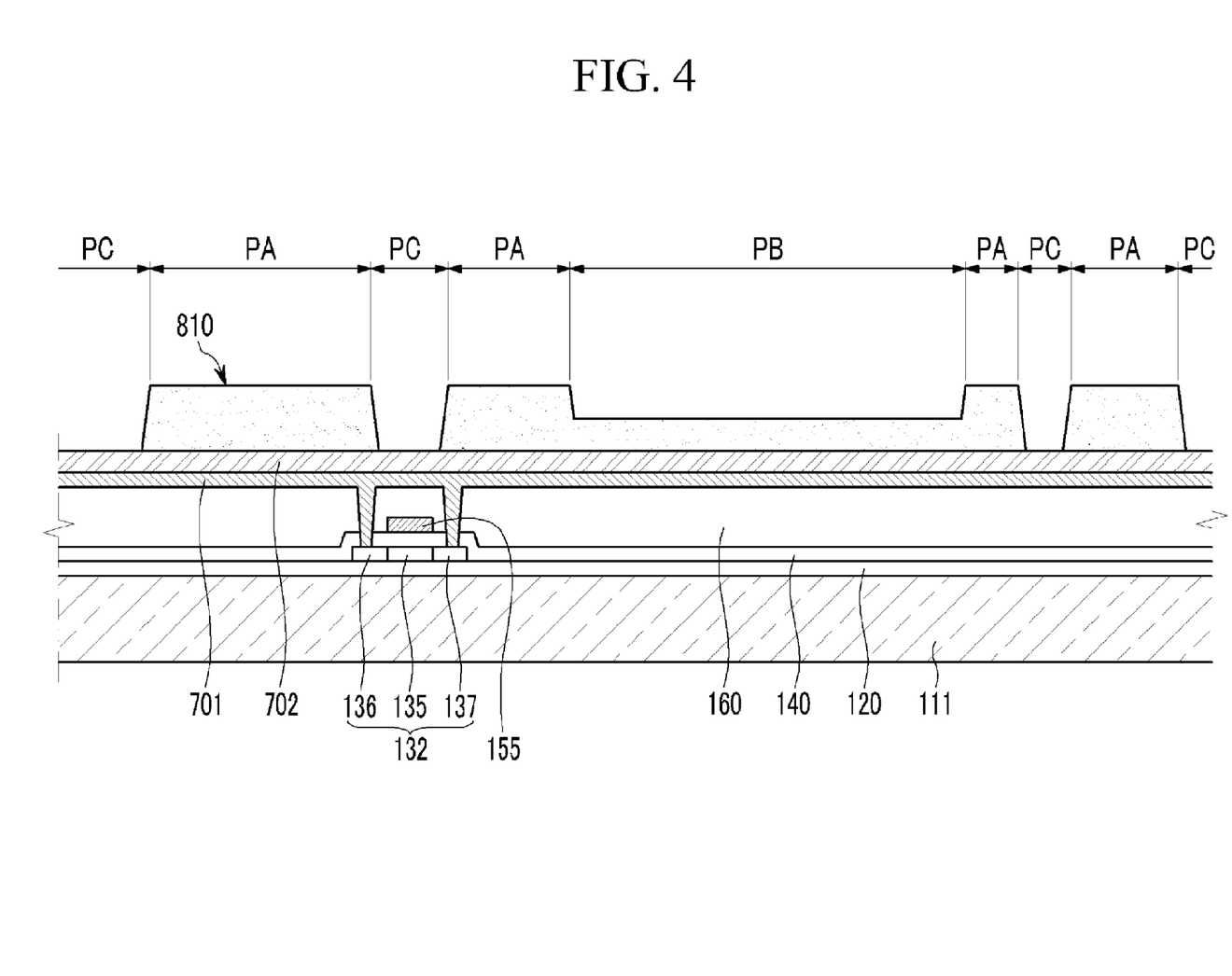

Thereafter, as shown in FIG. 4, the half-tone exposed photosensitive material layer 801 is developed, to thereby form a photoresist pattern 810. The photoresist pattern 810 has a first portion PA with a largest thickness, a second portion PB with an intermediate thickness, and a third portion PC with a smallest thickness. The third portion PC has the smallest thickness (i.e., substantially no thickness) in consideration of the case where the photosensitive material layer 801 is intended to be completely removed, but the third portion PC may not be completely removed, so long as it does not influence subsequent processes.

The first portion PA of the photoresist pattern 810 corresponds to the light blocking section MB of the mask 901, the second portion PB of the photoresist pattern 810 corresponds to the semi-transparent section MS of the photoresist pattern 810, and the third portion PC of the photoresist pattern 810 corresponds to the transparent section MT of the mask 901. That is, the light-exposed portions of the photosensitive material layer 801 are removed through developing, while the non-exposed portions thereof remain, even after the developing is completed. However, the present invention is not limited thereto. For example, depending upon the composition of the photosensitive material layer 801, the non-exposed portions of the photosensitive material layer 801 may be removed through developing, while the light-exposed portions thereof may not be removed.

Figure 5:
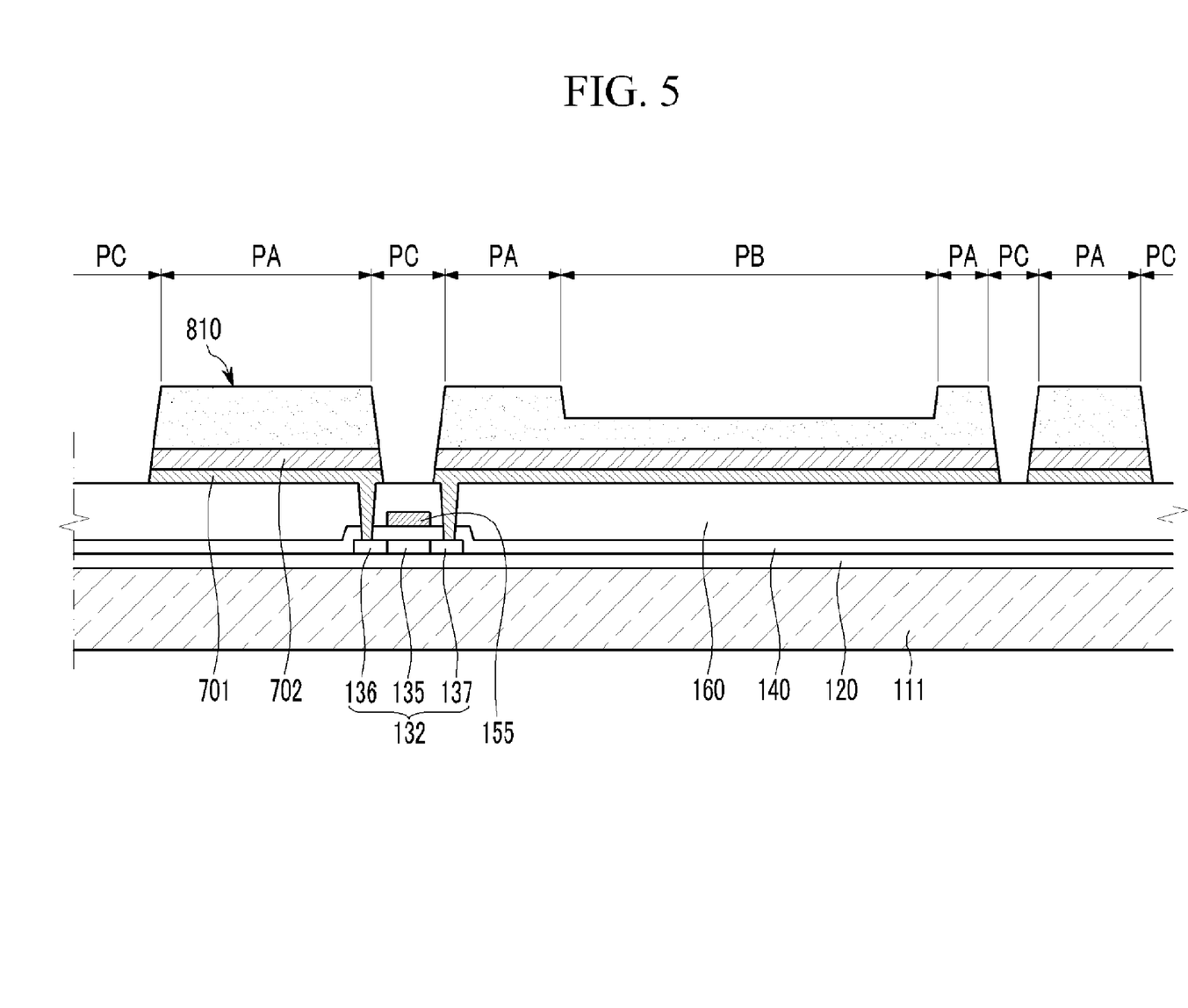
Figure 6:
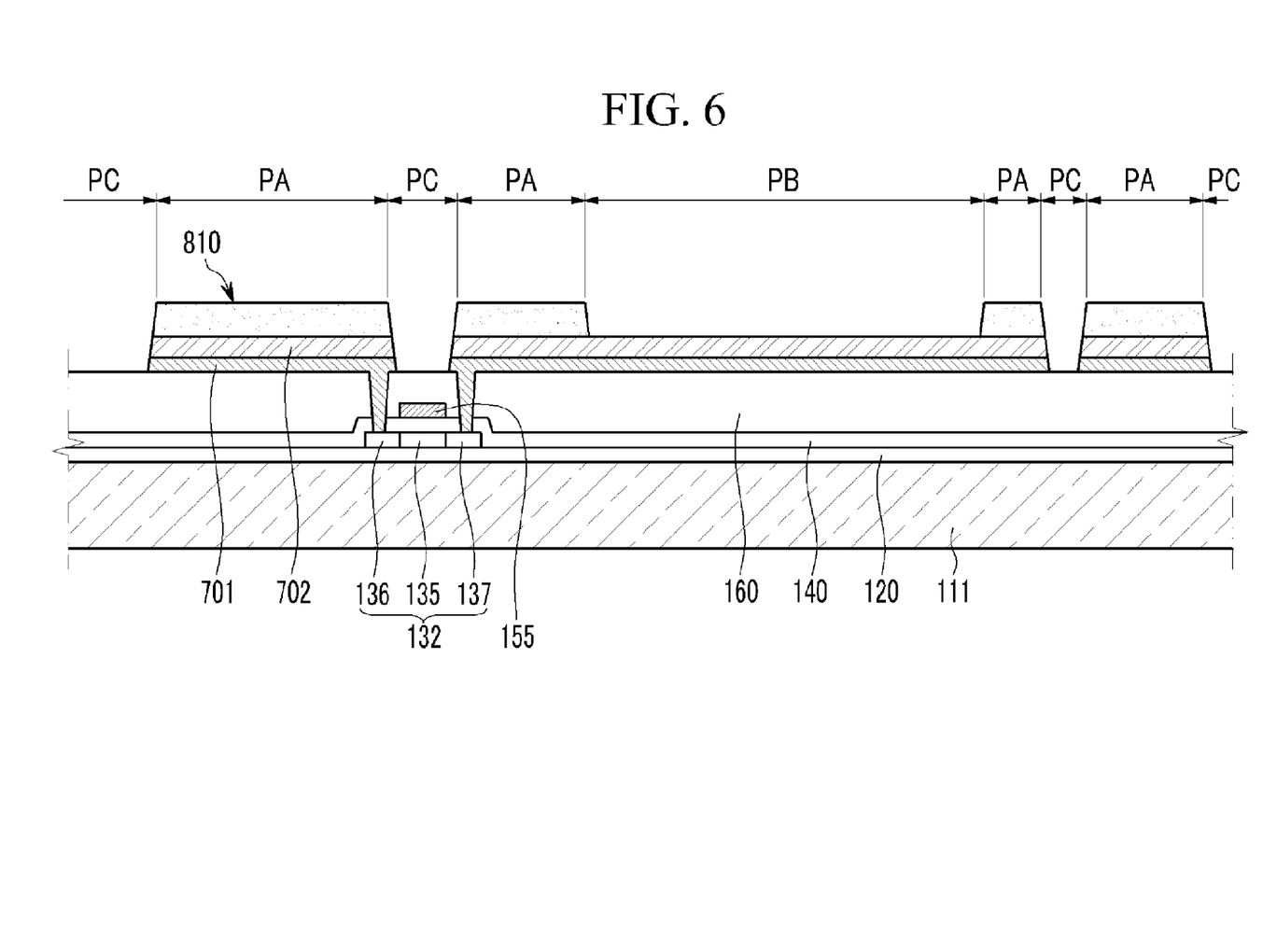

Thereafter, as shown in FIG. 5, the second and first conductive layers 702 and 701, corresponding to the third portion PC of the photoresist pattern 810, are sequentially etched and removed, using the photoresist pattern 810. Then, as shown in FIG. 6, the second portion PB of the photoresist pattern 810 is removed. At this time, the first portion PA of the photoresist pattern 810 is removed to a certain degree, such that the first portion PA of the photoresist pattern 810 is reduced in thickness.

Figure 7:
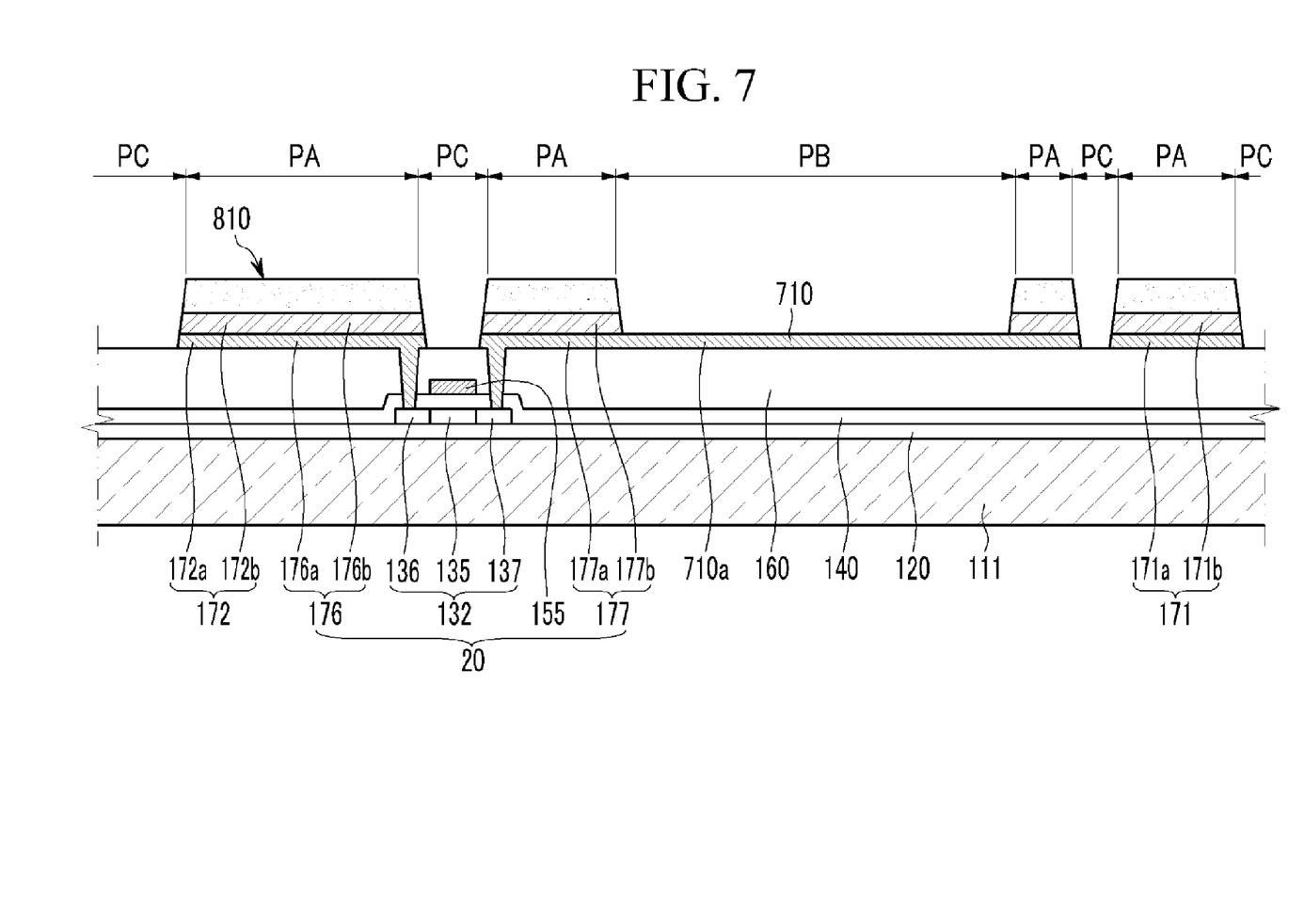

As shown in FIG. 7, the second conductive layer 702, corresponding to the second portion PB of the photoresist pattern 810, is etched and removed using the photoresist pattern 810, from which the second portion PB has been removed. Consequently, the first and second conductive layers 701 and 702 are patterned, to thereby form the driving source electrode 176, the driving drain electrode 177, the data line 171, the common power line 172, and the pixel electrode 710, respectively.

In this way, the driving source electrode 176, the driving drain electrode 177, the data line 171, and the common power line 172, each having a double-layered structure with the first and second patterned conductive layers 176a, 177a, 171a, and 172a, and 176b, 177b, 171b, and 172b, and the pixel electrode 710 having a single-layered structure with only the first patterned conductive layer 710a, may be simultaneously formed, through a single thin film process, using the mask 901.

Figure 8:
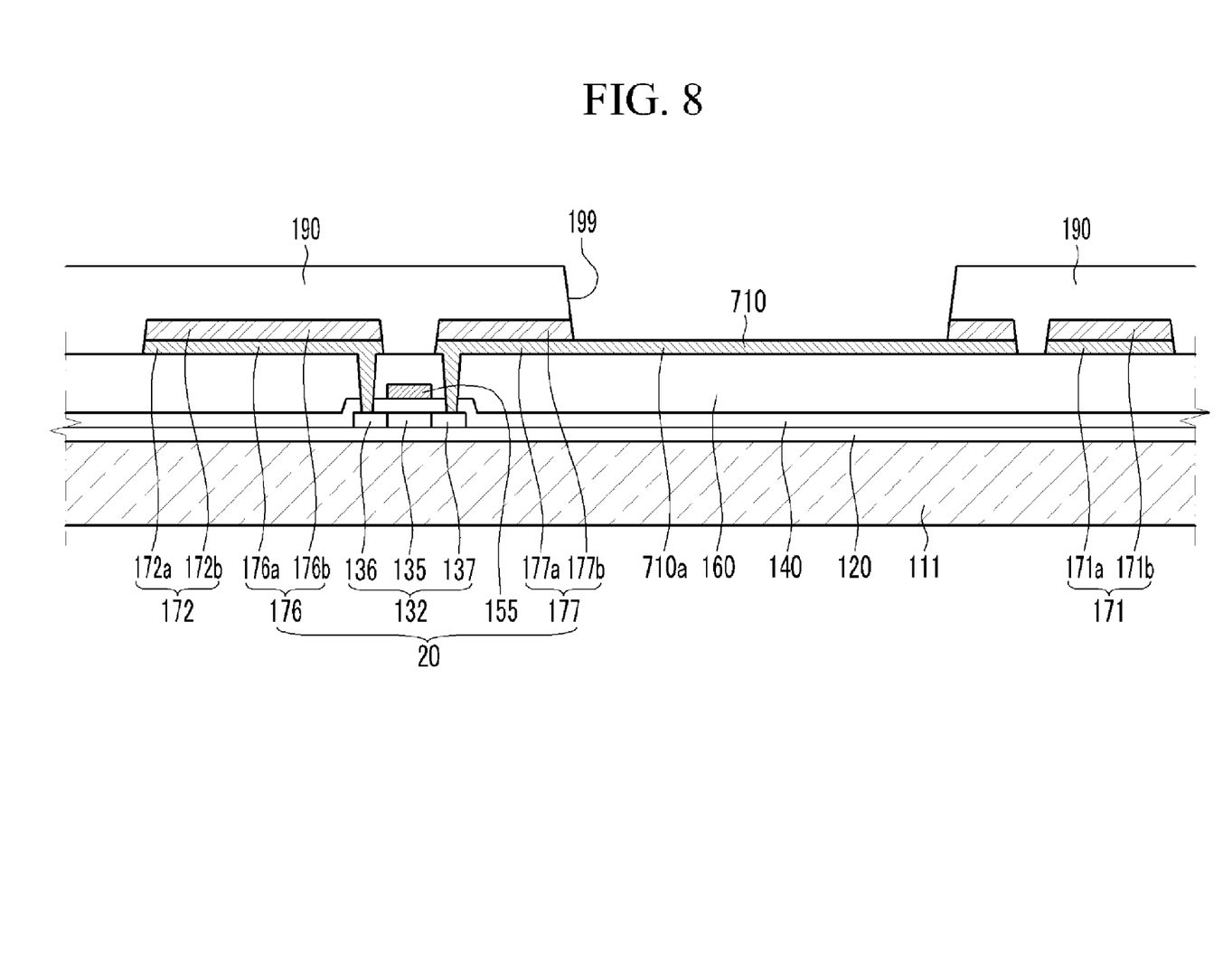

As a result, the first portion PA of the photoresist pattern 810 corresponds to a formation region of the driving source electrode 176, the driving drain electrode 177, the data line 171, and the common power line 172; and the second portion PB of the photoresist pattern 810 corresponds to a formation region of the pixel electrode 710. After the first portion PA of the photoresist pattern 810 is completely removed, as shown in FIG. 8, the pixel definition layer 190 is formed, and includes the opening 199 exposing the pixel electrode 710.

The first conductive layers 176a, 177a, 171a, 172a, and 710a are then crystallized. The crystallization of the first conductive layers 176a, 177a, 171a, 172a, and 710a may be done using various well-known techniques. The crystallizing of the first conductive layers 176a, 177a, 171a, 172a, and 710a may be conducted any time after the formation of the first conductive layers 176a, 177a, 171a, 172a, and 710a, and before the completion of the organic light emitting diode display 100. That is, the timing of the crystallization of the first conductive layers 176a, 177a, 171a, 172a, and 710a is not specifically limited. Thereafter, the organic emissive layer 720 and the common electrode 730 are sequentially formed, to thereby form the organic light emitting diode display 100, as shown in FIG. 2.

With such a manufacturing method, the processing of the organic light emitting diode display 100 can be simplified. Particularly, it becomes possible, in a rear-emission organic light emitting diode display 100, to form a pixel electrode and a driving drain electrode simultaneously.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. A method of manufacturing an organic light emitting diode display, comprising:
    forming an amorphous silicon layer on a substrate;
    forming a gate insulating layer on the amorphous silicon layer;
    forming a gate electrode on the gate insulating layer;
    crystallizing and doping the amorphous silicon layer, to form a semiconductor layer having a channel region, a source region, and a drain region;
    forming an interlayer insulating layer on the gate electrode;
    forming contact holes in the interlayer insulating layer and the gate insulating layer, to expose the source and the drain regions;
    forming a first conductive layer on the interlayer insulating layer, such that the first conductive layer contacts the source and drain regions of the semiconductor layer, through the contact holes;
    forming a second conductive layer on the first conductive layer;
    patterning the first and second conductive layers through photolithography, to form source and drain electrodes, and patterning the second conductive layer to form a pixel electrode,
    wherein the source and drain electrodes are double-layered structures and the pixel electrode is a single-layered structure.

2. The method of claim 1, wherein the photolithography is conducted using a photoresist pattern formed through a half-tone exposure process.

3. The method of claim 2, wherein the photoresist pattern comprises:
    a first portion disposed at a formation region of the source and drain electrodes;
    a second portion at a formation region of the pixel electrode, which is thinner than the first portion; and
    a third portion exposing the second conductive layer.

4. The method of claim 3, wherein the photolithography process comprises:
    forming the photoresist pattern on the second conductive layer;
    sequentially etching and removing portions of the second and first conductive layers corresponding to the third portion of the photoresist pattern, using the photoresist pattern;
    removing the second portion of the photoresist pattern; and
    etching and removing a portion of the second conductive layer corresponding to the second portion of the photoresist pattern, using the photoresist pattern, after the second portion of the photoresist pattern is removed.

5. The method of claim 1, wherein the first conductive layer comprises at least one material selected from the group consisting of indium tin oxide (ITO), indium zinc oxide (IZO), zinc oxide (ZnO), and indium oxide (In$_2$O$_3$).

6. The method of claim 5 further comprising crystallizing the first conductive layer.

7. The method of claim 1, further comprising forming a pixel definition layer on the source and drain electrodes, the pixel definition layer having an opening exposing the pixel electrode.

8. The method of claim 7, further comprising:
    forming an organic emissive layer on the pixel electrode, within the opening of the pixel definition layer; and
    forming a common electrode on the organic emissive layer and the pixel definition layer.

9. The method of claim 8, wherein the organic emissive layer emits light toward the pixel electrode.

10. The method of claim 8, wherein the common electrode comprises a reflective layer comprising at least one material selected from the group consisting of lithium (Li), calcium (Ca), lithium fluoride/calcium (LiF/Ca), lithium fluoride/aluminum (LiF/Al), aluminum (Al), silver (Ag), magnesium (Mg), and gold (Au).

11. A method of manufacturing an organic light emitting diode display, comprising:

forming a first conductive layer on an interlayer insulating layer, such that the first conductive layer contacts source and drain regions of a semiconductor layer, through contact holes formed in the interlayer insulating layer;

forming a second conductive layer on the first conductive layer;

patterning portions the first and second conductive layers, to form source and drain electrodes, and patterning other portions of the second conductive layer, to form pixel electrode, wherein the source and drain electrodes are double-layered structures and the pixel electrode is a single-layered structure.

* * * * *